United States Patent
Chang et al.

(10) Patent No.: US 9,006,909 B2
(45) Date of Patent: Apr. 14, 2015

(54) SOLDER MASK SHAPE FOR BOT LAMINATE PACKAGES

(71) Applicant: Taiwan Semiconductor Manufacturing Company, Ltd., Hsin-Chu (TW)

(72) Inventors: Chih-Horng Chang, Taipei (TW); Sheng-Yu Wu, Hsin-Chu (TW); Pei-Chun Tsai, Zhongli (TW); Tin-Hao Kuo, Hsin-Chu (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 164 days.

(21) Appl. No.: 13/733,537

(22) Filed: Jan. 3, 2013

(65) Prior Publication Data

US 2014/0186591 A1   Jul. 3, 2014

(51) Int. Cl.
 *G03F 1/00*   (2012.01)
(52) U.S. Cl.
 CPC ......... *G03F 1/14* (2013.01); *H01L 2224/16225* (2013.01)

(58) Field of Classification Search
 CPC ............. H01L 2224/0401; H01L 2224/10175; H01L 2224/11912
 USPC ........ 428/195.1; 438/108, 612, 613; 257/678, 257/E21.499
 See application file for complete search history.

(56) References Cited

U.S. PATENT DOCUMENTS

2004/0212050 A1   10/2004   Fujii et al.
2006/0160346 A1 *   7/2006   Hori .............................. 438/612

FOREIGN PATENT DOCUMENTS

JP   2005011826   1/2005

* cited by examiner

*Primary Examiner* — Roy Potter
(74) *Attorney, Agent, or Firm* — Slater & Matsil, L.L.P.

(57) ABSTRACT

A device is provided. The device may comprise an integrated circuit package. The integrated circuit package may comprise a first layer and a solder mask. The first layer may comprise a top surface wherein the solder mask is disposed on the top surface of the first layer. The solder mask may comprise a vertical edge. The vertical edge may form an angle between the top surface of the first layer and the vertical edge of not less than 90 degrees. The angle may be not less than 120 degrees or not less than 150 degrees.

20 Claims, 3 Drawing Sheets

SOLDER MASK SHAPE FOR BOT LAMINATE PACKAGES

BACKGROUND

In the manufacturing of integrated circuit packages (e.g., bump-on-trace laminate packages), a solder mask is used to physically and electrically insulate portions of the circuit. A solder mask generally defines the portions of the circuit where no solder or soldering is required. A solder mask comes in a variety of differing media, depending on the particular demands of the application.

Conventional methods often apply the solder mask to the underlying structure (e.g., a substrate layer, semiconductor layer, etc.) using, for example, lithographic processes, such that the solder mask is formed as a layer on the underlying structure. The solder mask layer may include openings for vias, solder bumps, conductor pads, etc. The solder mask layer generally includes one or more, or a plurality of vertical edges around the peripheral edge, defining the walls of the openings, etc. The solder mask edges may be adjacent other components of the integrated circuit package.

There is a need for an improved solder mask shape for integrated circuit packages that overcomes the aforementioned, as well as other, deficiencies in the conventional methods.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1:
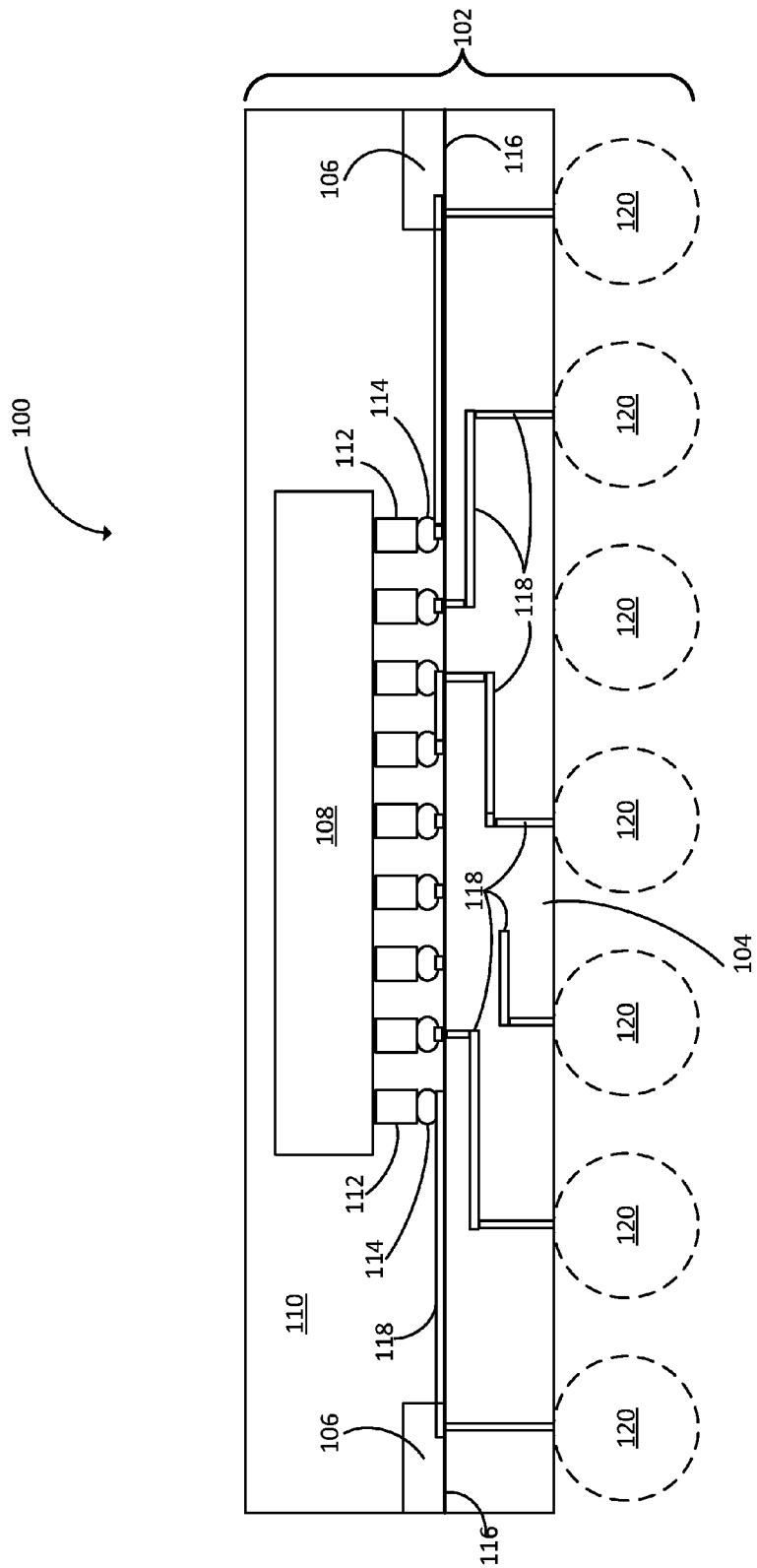
FIG. 1 illustrates a cross-sectional view of a device in accordance with embodiments, wherein a vertical edge of the solder mask forms an angle with a substrate layer of at least 90 degrees.
Figure 2:
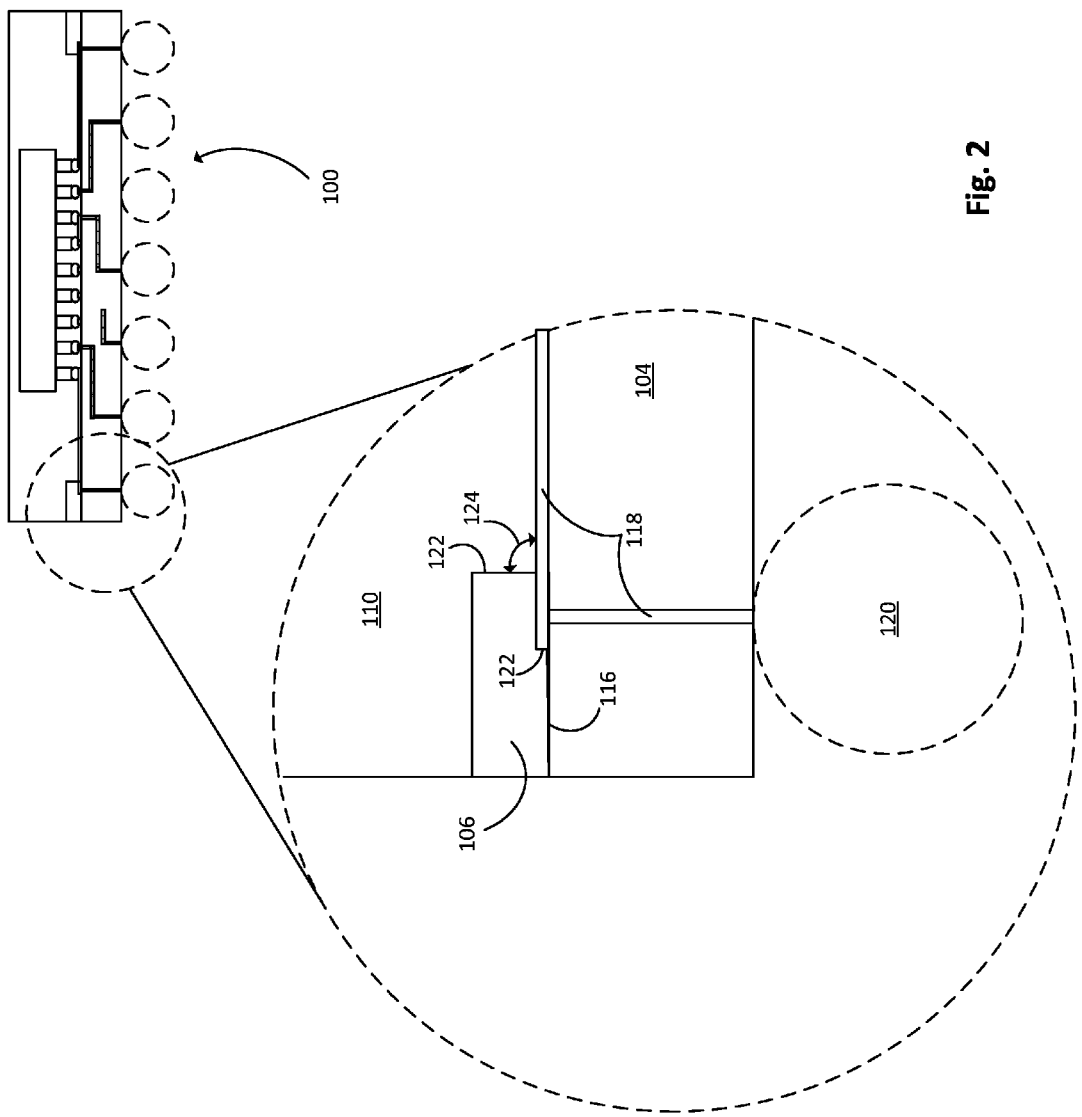
FIG. 2 illustrates the cross-sectional view of the device of FIG. 1 shown in greater detail.

Referring to FIGS. 1 and 2, shown therein is a cross-sectional view of an exemplary device 100 constructed in accordance with the present disclosure. FIG. 2 shows a portion of the device 100 of FIG. 1 in greater detail. The device 100 may be an integrated circuit package, e.g., a bump-on-trace laminate package. The device 100 may comprise an integrated circuit (IC) package 102. The IC package 102 may comprise a first layer 104, a solder mask 106 (two solder masks 106 being shown in FIG. 1 by way of example), an IC chip 108, and a molded underfiller (MUF) layer 110. The IC chip 108 may comprise a plurality of contacts 114 and a plurality of copper pillars 112, the pillars 112 positioned on the contacts 114, such as lead free solder, and generally providing electrical contact points for the IC chip 108. The IC chip 108 may be positioned on or within the MUF layer 110. The solder mask 106 (also referred to as a solder resist) may be disposed on a top surface 116 of the first layer 104 (shown in greater detail in the expanded view of FIG. 2). The solder mask 106 may be applied, printed, dry film pasted or otherwise positioned on the top surface 116 utilizing a lithography process, for example.

The first layer 104 may be a substrate layer, a bump-on-trace layer, a layer formed using semiconductor bonding technology, an integrated circuit die, a printed circuit board (PCB), etc. In the exemplary IC package 102 shown in FIG. 1, the first layer 104 is a substrate layer. The first layer 104 may include a trace 118 formed on and/or within the first layer 104 (the first layer 104 of FIG. 1 comprising a plurality of traces 118). The trace 118 may be, e.g., a contact land configured to receive, or otherwise connect to, an electrical contact, a pillar, a solder bump, etc., and may provide an electrically conductive path. In the first layer 104 shown in FIG. 1, the traces 118 are configured to provide an electrically conductive path between the pillars 112 and, e.g., a plurality of solder balls (Ball Grid Array, BGA) 120, the solder balls 120 being shown in phantom line in FIGS. 1 and 2. The solder mask 106 covers and hence protects portions of first layer 104 that need not be in contact while leaving exposed portions of first layer 104 that need to be in contact, such as the portion including the trace 118.

The solder mask 106 may comprise a vertical edge 122 In accordance with certain aspects of the present disclosure, the vertical edge 122 of the solder mask 106 may form an angle 124 of not less than ninety (90) degrees with the top surface 116 of the substrate 104. According to certain embodiments, the vertical edge 122 is adapted such that the angle 124 is not less than one hundred twenty (120) degrees. According to some embodiments, the vertical edge 122 is adapted such that the angle 124 is not less than one hundred fifty (150) degrees. According to additional embodiments, the angle 124 is ninety (90) degrees, i.e., the vertical edge 122 is perpendicular to the top surface 116. In accordance with other embodiments, the vertical edge 122 may be adapted such that the angle 124 is any angle greater than 90 degrees.

The vertical edge 122 of the solder mask 106 forming the angle 124 with the top surface 116 of not less than ninety (90) degrees reduces or eliminates an undercut at the interface or junction between the vertical edge(s) 122 of the solder mask 106 and the top surface 116 of the first layer 104. An undercut at said interface would generally refer to a gradual or a sudden sloping inward of the vertical edge 122 of the solder mask 106 towards itself at or near said interface. The undercut may result in a void wherein contaminants can reside and/or grow. These contaminants may lead to the premature failure of the device 100.

Figure 3:
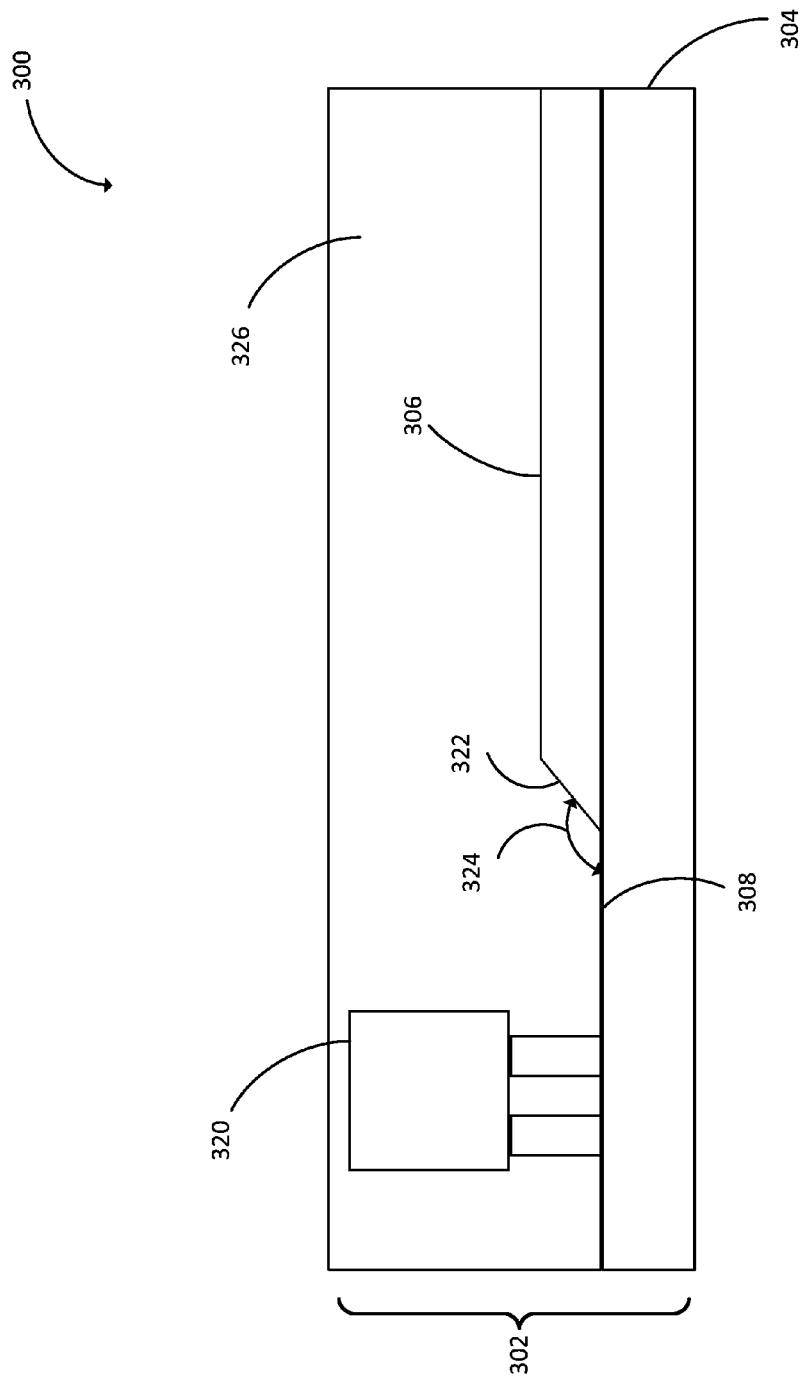
FIG. 3 illustrates a cross-sectional view of a device in accordance with various other embodiments, wherein the vertical edge of the solder mask forms an angle with a substrate layer of greater than 90 degrees as well as the device further including a die.

FIG. 3 illustrates a cross-section view of an exemplary device 300 according to various other embodiments of the present disclosure. The embodiment in FIG. 3 is similar to the embodiment of the device 100 shown in FIGS. 1 and 2, in that the device 300 comprises an integrated circuit package 302 further comprising, for example, a first layer 304 including a top surface 308, and a solder mask 306 comprising a vertical edge 322 forming an angle 324 with the top surface 308. The embodiment of the device 300 shown in FIG. 3 may further comprise one or more die 320 (one being shown by way of example) and also a molded underfill (MUF) layer 326 proximate the first layer 304 and the solder mask 306. The vertical edge 322 forming the angle 324 between the vertical edge 322 and the top surface 308 of the first layer 304 prevents and/or eliminates an undercut at the interface of the solder mask 306, the first layer 304, and the MUF 326.

The vertical edge(s) 122 and 322 may be formed on the solder mask 106 and 306, respectively, so as to have the herein described shape, i.e., so as to form the angles 124 and/or 324 that prevent or eliminate the undercut at the interface between the vertical edge(s) 122/322 and the top surfaces 116/308 of the first layers 104/304, respectively. In accordance with certain embodiments, the vertical edge(s) 122 and/or 322 may be formed by adjusting certain parameters of the lithographic process. Generally, the lithographic process involves exposing the solder mask 106/306 to a light source (e.g., a ultraviolet light source), the light source being projected through a mask to remove portions of the solder masks 106 and/or 306. A predetermined amplitude or intensity of the light source (e.g., a photo energy amplitude of the light source) may determine an amount of material that is removed from the solder masks 106/306. In accordance with certain aspects of the disclosure, the predetermined amplitude (or photo energy amplitude) is adjusted so as to determine the shape of the vertical edge(s) 122 and/or 322 and, by extension, the angles 124 and/or 324. By way of example, the amplitude of the photo light source may be increased to a predetermined level so as to improve the polymerization behavior of the solder mask material, thus reducing or eliminating the undercut at said interface. In some embodiments, it has been found that a photo energy amplitude of 5~25 $mJ/cm^2$ applied to a solder mask 106/306 having a thickness of 40 μm will produce the herein described shape of the vertical edges 122/322 so as to eliminate the undercut at the interface between the vertical edges 122 and/or 322 and the top surface 116/308, respectively. Other embodiments may utilize a photo energy amplitude of 10 to 20 $mJ/cm^2$ applied to a solder mask 106/306 having a thickness of between 35 and 45 μm. Even further embodiments may utilize a photo energy amplitude of 15 $mJ/cm^2$ applied to a solder mask 106/306 having a thickness of 40 μm.

Other aspects may provide for adjusting the soft baking parameters of the lithographic process. Generally, a first step of the lithographic process may provide for disposing a liquid solder resist material onto the substrate layer. The liquid solder resist material may be printed onto the substrate layer and then exposed to a low temperature for a certain time, what may be referred to as the soft baking process. After this soft bake process, the substrate/solder resist structure may be exposed to the light source through the mask. Adjusting, for example, the temperature and/or the time of the soft baking process may change the sensitivity of the solder mask material so as to reduce or eliminate the undercut at said interface.

In accordance with some embodiments, the vertical edge(s) 122 and/or 322 may be formed by adjusting the chemical composition of the material forming the solder mask. Generally, the chemical composition of the material forming the solder mask 106/306 may determine such features as the rigidity, the density, the weight, etc., of said solder mask. Chemical compositions used to form the solder masks 106 or 306 may include, but are not limited to, an alkyd resin, an acrylated epoxy resin, a methacrylated epoxy resin, a UV curable solder resist, and the like. Adjusting or modifying the chemical composition of the material forming the solder masks 106/306 may further determine the reaction the solder masks 106/306 may have to, for example, the light source used in the lithographic process. Certain aspects may provide for adjusting the mixing ratio of the epoxy and the acrylic so as to affect the crosslink behavior of the solder mask to, thereby, reduce or eliminate the undercut at said interface. In accordance with some embodiments, the solder mask 106/306 may be formed of a material having a chemical composition of Silica (amorphous), Barium Sulfate and Epoxy resin, etc. Some embodiments may provide for a ratio of the epoxy and the acrylic mixture of 15 percent epoxy and 15 percent acrylic.

In accordance with certain embodiments, the vertical edge(s) 122 and/or 322 may be formed by adjusting the resistance type, or other features of the solder mask. As one example, certain aspects may provide for the reduction of the dosage of pigment dyes to the solder mask so as to make the solder mask more transparent. Generally, solder masks include pigment dyes that are green, blue, or even black (in the case of military applications). In accordance with aspects of the present disclosure, reducing said pigment dyes may provide for a more transparent solder mask with an increased exposure of the light source to the bottom side of the solder mask, e.g., the side of the solder mask proximate the surfaces 116/308. The increased exposure to the bottom side of the solder mask may even further reduce or eliminate the undercut at said interface.

Other aspects may provide for any, or all of the above-described modifications and/or adjustments (e.g., adjusting the amplitude of the light source, changing the chemical composition, reducing the pigment dyes, etc.) to be used in combination so as to reduce or eliminate the undercut at said interface.

In accordance with certain embodiments, a method of forming a device integrated circuit is provided. The method may comprise providing a first layer. The first layer may include a top surface. The first layer may be a substrate layer. The method may also comprise disposing a solder mask on the top surface of the first layer. The solder mask may comprise a vertical edge and have a predetermined mask thickness. The method may even further comprise exposing the solder mask to a light source having a predetermined photo energy amplitude. The predetermined mask thickness and the photo energy amplitude may be selected such that an angle between the vertical edge of the solder mask and the top surface is not less than 90 degrees.

In accordance with additional embodiment, another method of forming a device integrated circuit package is provided. The method may comprise providing a first layer. The first layer may include a top surface. The method may also comprise disposing a solder mask on the top surface of the first layer. The solder mask may comprise a vertical edge. The solder mask may be formed of a predetermined chemical composition. The method may even further comprise exposing the solder mask to a light source. The predetermined chemical composition may be selected such that an angle between the vertical edge of the solder mask and the top surface is not less than 90 degrees.

In accordance with certain embodiments, a device is provided. The device may comprise an integrated circuit package. The integrated circuit package may comprise a first layer and a solder mask. The first layer may comprise a top surface wherein the solder mask is disposed on the top surface of the first layer. The solder mask may comprise a vertical edge. The vertical edge may form an angle between the top surface of the first layer and the vertical edge of not less than 90 degrees. The angle may be not less than 120 degrees or not less than 150 degrees.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
an integrated circuit package comprising;
a first layer having a top surface; and
a solder mask disposed on the top surface of the first layer, the solder mask comprising a vertical edge, wherein the vertical edge forms an angle between the top surface of the first layer and the vertical edge of not less than 120 degrees.

2. The device of claim 1, wherein the angle between the top surface of the first layer and the vertical edge is not less than 150 degrees.

3. The device of claim 1, wherein the solder mask includes a window in which a bump-on-trace connector is formed.

4. The device of claim 1, wherein the first layer is a bonded semiconductor layer.

5. The device of claim 1, wherein the first layer is a substrate layer.

6. A method of forming an integrated circuit package comprising:
providing a first layer having a top surface;
disposing a solder mask on the top surface of the first layer, the solder mask comprising a vertical edge and having a predetermined mask thickness; and
exposing the solder mask to a light source having a predetermined photo energy amplitude, wherein the predetermined mask thickness and the photo energy amplitude are selected such that an angle between the vertical edge of the solder mask and the top surface is not less than 90 degrees.

7. The method of claim 6, wherein the solder mask is formed of a material comprising a pigment dye and the pigment dye is selected such that the solder mask is substantially transparent.

8. The method of claim 6, wherein the predetermined mask thickness is 40 µm and the predetermined photo energy amplitude is 15 mJ/cm$^2$.

9. The method of claim 6, wherein the predetermined mask thickness is between 35 and 45 µm and the predetermined photo energy amplitude is between 10 and 20 mJ/cm$^2$.

10. The method of claim 6, wherein the predetermined mask thickness is 40 µm and the predetermined photo energy amplitude is between 5 and 25 mJ/cm$^2$.

11. The method of claim 6, wherein the integrated package is a window open type solder resist of bump-on-trace laminate package.

12. A method of forming an integrated circuit package comprising:
providing a first layer having a top surface;
disposing a solder mask on the top surface of the first layer, the solder mask comprising a vertical edge and being formed of a predetermined chemical composition; and
exposing the solder mask to a light source, wherein the predetermined chemical composition is selected such that an angle between the vertical edge of the solder mask and the top surface is not less than 90 degrees.

13. The method of claim 12, wherein the predetermined chemical composition includes a ratio of 15 percent epoxy to 15 percent acrylic.

14. The method of claim 12, wherein the predetermined chemical composition comprises amorphous silica, barium sulfate, and epoxy resin.

15. The method of claim 12, wherein the predetermined chemical composition comprises a dye and the dye is selected such that the solder mask is substantially transparent.

16. The method of claim 12, wherein the integrated package is a window open type solder resist of bump-on-trace laminate package.

17. The method of claim 12, wherein the first layer is a bonded semiconductor layer.

18. The method of claim 12, wherein the first layer is an integrated circuit die.

19. The method of claim 12, further comprising baking the integrated circuit package for a bake time period and at a bake temperature, wherein the bake time period and the bake temperature are selected such that the angle between the vertical edge of the solder mask and the top surface is not less than 120 degrees.

20. The device of claim 1, wherein the vertical edge of the solder mask is a sidewall of an opening exposing a conductive trace on the first layer.

* * * * *